US009998129B1

(12) United States Patent
Zhuang et al.

(10) Patent No.: US 9,998,129 B1
(45) Date of Patent: Jun. 12, 2018

(54) PLL POST DIVIDER PHASE CONTINUITY

(71) Applicant: QUALCOMM Incorporated, San Diego, CA (US)

(72) Inventors: Jingcheng Zhuang, San Diego, CA (US); Jianyun Hu, San Diego, CA (US); Animesh Paul, Bangalore (IN); Xinhua Chen, San Diego, CA (US); Frederic Bossu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days. days.

(21) Appl. No.: 15/711,962

(22) Filed: Sep. 21, 2017

(51) Int. Cl.
| | |
|---|---|
| *H03D 3/24* | (2006.01) |
| *H03L 7/18* | (2006.01) |
| *H03L 7/099* | (2006.01) |
| *H04L 7/00* | (2006.01) |
| *H03L 7/197* | (2006.01) |
| *H04L 7/033* | (2006.01) |
| *H03L 7/093* | (2006.01) |

(52) U.S. Cl.
CPC ........... *H03L 7/1803* (2013.01); *H03L 7/093* (2013.01); *H03L 7/0992* (2013.01); *H03L 7/1976* (2013.01); *H04L 7/0008* (2013.01); *H04L 7/033* (2013.01)

(58) Field of Classification Search
CPC ... H03L 7/1803; H03L 7/0992; H03L 7/1976; H03L 7/093; H03L 7/0891; H03L 7/16; H03L 7/113; H04L 7/0008; H04L 7/033; H03K 23/54; H03K 21/08
USPC .................................. 375/376, 373, 374, 375
See application file for complete search history.

(56) References Cited

U.S. PATENT DOCUMENTS

| | | | |
|---|---|---|---|
| 6,559,698 B1 * | 5/2003 | Miyabe | G06F 1/04 327/117 |
| 6,952,125 B2 | 10/2005 | Ahn et al. | |
| 7,405,628 B2 | 7/2008 | Hulfachor et al. | |
| 9,197,466 B2 | 11/2015 | Tarighat | |
| 9,490,826 B1 | 11/2016 | Wang et al. | |
| 2003/0052740 A1 * | 3/2003 | Salmi | H03K 21/08 331/100 |
| 2004/0085103 A1 * | 5/2004 | Ahn | H03L 7/1978 327/156 |
| 2005/0237119 A1 * | 10/2005 | Irie | H03L 7/113 331/16 |
| 2008/0238498 A1 * | 10/2008 | Lam | H03L 7/16 327/117 |
| 2009/0184773 A1 * | 7/2009 | Woo | H03L 7/0891 331/1 R |

(Continued)

OTHER PUBLICATIONS

Hati M.K., et al., "Efficient Design Technique for Pulse Swallow Based Fractional-N frequency Divider", IEEE International Symposium on Circuits and Systems, Jul. 2015, pp. 457-460.

*Primary Examiner* — Phuong Phu
(74) *Attorney, Agent, or Firm* — Haynes and Boone, LLP

(57) ABSTRACT

A phase continuity architecture is provided to maintain the phase continuity for a post divider output signal from a post divider that post divides a PLL output signal. A pulse swallower removes a pulse from the PLL output signal responsive to an edge is a divided feedback clock signal. A sampler samples the post divider output signal responsive to a detection of the missing pulse to determine a phase relationship between the post divider output signal and the divided feedback clock signal.

20 Claims, 5 Drawing Sheets

(56) References Cited

U.S. PATENT DOCUMENTS

2010/0039182 A1* 2/2010 Galton .................. H03K 23/54
                                                          331/1 A
2017/0338940 A1* 11/2017 Zanuso .................. H04L 7/033

* cited by examiner

PLL POST DIVIDER PHASE CONTINUITY

TECHNICAL FIELD

This application relates to fractional-N phase-locked loops (PLLs), and more particularly to a fractional-N PLL with a post divider having a known phase relationship to a reference clock.

BACKGROUND

An integrated circuit such as a system-on-a-chip (SoC) often includes sub-systems such as receivers and transmitters that are clocked by corresponding clock signals. To keep the various sub-systems synchronized, it is conventional for an SoC to include a reference clock transmitter that provides a reference clock to a plurality of PLLs. The use of fractional-N PLLs provides greater flexibility with regard to the clocking frequency. In contrast, the clock frequency from an integer-N PLL has an integer relationship to the reference clock. But a fractional-N PLL untethers the sub-system clocking from such an integer relationship so that the sub-system clock frequencies can have a non-integer relationship to the reference clock. Such a non-integer relationship is particularly useful in modern telecommunication standards such as Long Term Evolution (LTE) or 5G in which a cellular handset is assigned a certain frequency band across an operating bandwidth. The frequency flexibility of a fractional-N PLL enables the handset to operate in its assigned frequency band. To provide additional frequency tuning or flexibility, the output signal from a fractional-N PLL may be divided in a post divider. For example, an RF receiver or transmitter may form a local oscillator (LO) signal using such a post divider on the PLL output signal from a fractional-N PLL.

But frequency agility is not the only concern in fractional-N PLL design. In addition, SoC components must also have low power consumption to preserve battery life. It is thus conventional for a subsystem's PLL to be shut down or enter a sleep mode during idle periods. During sleep mode operation, the post divider is shut down and then powered back up when the PLL resumes normal operation. The LO output signal from the post divider will then have an unknown phase relationship with the reference clock frequency. For example, if the post divider divides the PLL output signal by two, the LO output signal may have either a 0 degree or 180 degree phase relationship to the reference clock frequency. Such an arbitrary phase relationship between the LO output signal and the reference clock signal upon resumption of normal operation degrades system performance. It is thus desirable to keep the post divider phase constant, both before and after sleep mode operation.

Despite the need to maintain such constant phase, current post divider phase continuity schemes are problematic. An example phase continuity architecture for a fractional-N PLL 100 is shown in FIG. 1. Fractional-N PLL 100 includes an analog portion 105 for generating a PLL output signal 170. To keep PLL output signal 170 phase aligned with a reference clock signal Fref, PLL output signal 170 is divided in a feedback divider 130 to form a divided clock signal (Fdiv) 165 that is compared with the reference clock signal (Fref) in a phase detector (PFD) 110. Depending upon whether the divided clock signal is leading or lagging the reference clock signal, phase detector 110 asserts either an up signal (Up) or a down signal (Dn). A charge pump 115 charges a charge pump output signal (Icp) if the up signal is asserted or discharges the charge pump output signal if the down signal is asserted. After filtering in a loop filter 120, the charge pump output signal becomes a tuning control voltage Vtune that controls the frequency of a voltage-controlled oscillator VCO 125. Should feedback divider 130 divide by a constant integer N, analog portion 105 forms a conventional integer-N PLL. However, fractional-N PLL 100 also includes a digital portion 135 that toggles or dithers the integer N used by fractional divider 130 to effect the desired integer plus some fraction relationship between the frequency of the reference clock signal and the clocking signal frequency for PLL output signal 170.

To perform the incrementing or dithering of the integer N used by feedback divider 130 to divide PLL output signal 170, digital portion 135 includes a phase accumulator or phase control circuit 140. As known in the fractional-N PLL arts, the fractional portion of the relationship between the reference clock signal frequency and the output clock signal frequency may be represented by a ratio (K/M), where K and M are positive integers. This ratio may also be represented by a fraction F. M is the modulus for the counting in phase control circuit 145 whereas K in the increment successively added to the phase accumulator count. Phase control circuit 140 thus receives the factor N.F, to identify the integer divider N and the fractional portion F. In one embodiment, the feedback divider 130 may be configured to divide by N+1 instead of N every time the modulo-N counting in phase control circuit 145 overflows. But such fractional-N PLL operation is then prone to developing undesirable spurs in the frequency spectrum for PLL output signal 170. To reduce such spurs, digital portion 135 may also include a delta-sigma modulator (DSM) 150 that further dithers the incrementing of the divisor N by feedback divisor 130.

A local oscillator portion 175 post divides PLL output signal 170 in a post divider 180 to form a local oscillator (LO) output signal. For example, post divider 180 may divide output clock by 2, or by 3, or by 4, and so on to form the LO output signal. But such a post division following a sleep mode of operation may change the phase relationship between the LO output signal and the reference clock as compared to the phase relationship that existed prior to the sleep mode. For example, with regard to a post division by two, one sub-system clock signal may be out of phase with another sub-system clock signal by 0 degrees or by 180 degrees phase such that the phase relationship becomes uncertain. To maintain a known phase relationship, the LO output signal is sampled by a register 185 as clocked by divided clock signal 165 from feedback divider 130. A digital LO phase corrector circuit 155 in digital portion 135 receives the sampled output from register 185 to sample the phase of the LO output signal. Depending upon the sampled phase, digital LO phase corrector circuit 155 adjusts the dithering of the feedback division by adding to the output of DSM 150 in an adder 160. Feedback divider 130 then adjusts its division responsive to a summed output signal from adder 160.

But note that LO portion 175 may be relatively remote from analog portion 105 such that PLL output signal 170 must be buffered for suitable propagation to LO portion 175. Divided clock signal 165 must then be similarly buffered across this propagation distance. The matching of the transmission channels for the PLL output signal 170 and divided clock signal 165 is quite difficult and cumbersome, particularly with regard to temperature and voltage drifts. Maintaining phase continuity for LO portion 175 is thus quite problematic.

Accordingly, there is a need in the art for improved phase continuity schemes for the post division of a PLL output signal from a fractional-N PLL.

SUMMARY

To provide a maintain a constant phase relationship between an output signal from a post divider for a fractional-N PLL and a reference clock signal for the fractional-N PLL, a pulse swallower circuit is provided that removes a pulse from a PLL output signal from the fractional-N PLL to form a modified PLL output signal. The pulse swallower circuit is configured to remove the pulse responsive to an edge for a divided feedback clock signal for the fractional-N PLL. A clock recovery circuit detects the missing pulse in the modified PLL output signal to assert a recovered version of the divided feedback clock signal to a sampling circuit such as a register. The sampling circuit samples the output signal from the post divider responsive to the assertion of the recovered version of the divided feedback clock signal to sample the phase relationship between the post divider output signal and the reference clock (and also the divided feedback clock signal). A digital phase corrector circuit adjusts the dithering of the feedback division in the fractional-N PLL to maintain a phase continuity for the sampled phase relationship.

For example, the digital phase corrector circuit may sample the phase relationship prior to a sleep mode of operation for the fractional-N PLL and/or the post divider. Following a termination of the sleep mode of operation and resumption of normal operation for the fractional-N PLL and the post divider, the digital phase corrector circuit again samples the phase relationship. If the phase relationship has changed from what existed prior to the sleep mode operation, the digital phase corrector circuit may then dither the feedback division accordingly to maintain phase continuity such that the phase relationship is maintained constant both before and after a sleep mode of operation. The resulting phase continuity is quite advantageous as it does not require any propagation of the divided feedback clock signal to the sampling circuit. Instead, the sampling timing is conducted through the missing pulse in the modified PLL output signal such that there needs to be no cumbersome balancing of a propagation of the divided feedback clock signal with the propagation of the modified PLL output signal.

These and other advantageous features may be better appreciated through the following detailed description.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

An improved post divider phase continuity scheme is provided that includes a pulse swallower circuit for the PLL output clock signal from a fractional-N PLL. The pulse swallower removes a pulse in the PLL output signal responsive to an edge of a divided feedback clock signal from the PLL's feedback divider to form a modified PLL output signal having the missing pulse. A clock recovery circuit detects the missing pulse to pulse a sampling circuit accordingly. The sampling circuit samples a post divided output signal resulting from the post division of the modified PLL output signal. The sampling is responsive to the pulse from the clock recovery circuit. A digital phase corrector circuit then responds to the sampling of the post divided output signal to dither the feedback division appropriately so that phase continuity is maintained for the post divided output signal.

Figure 1:
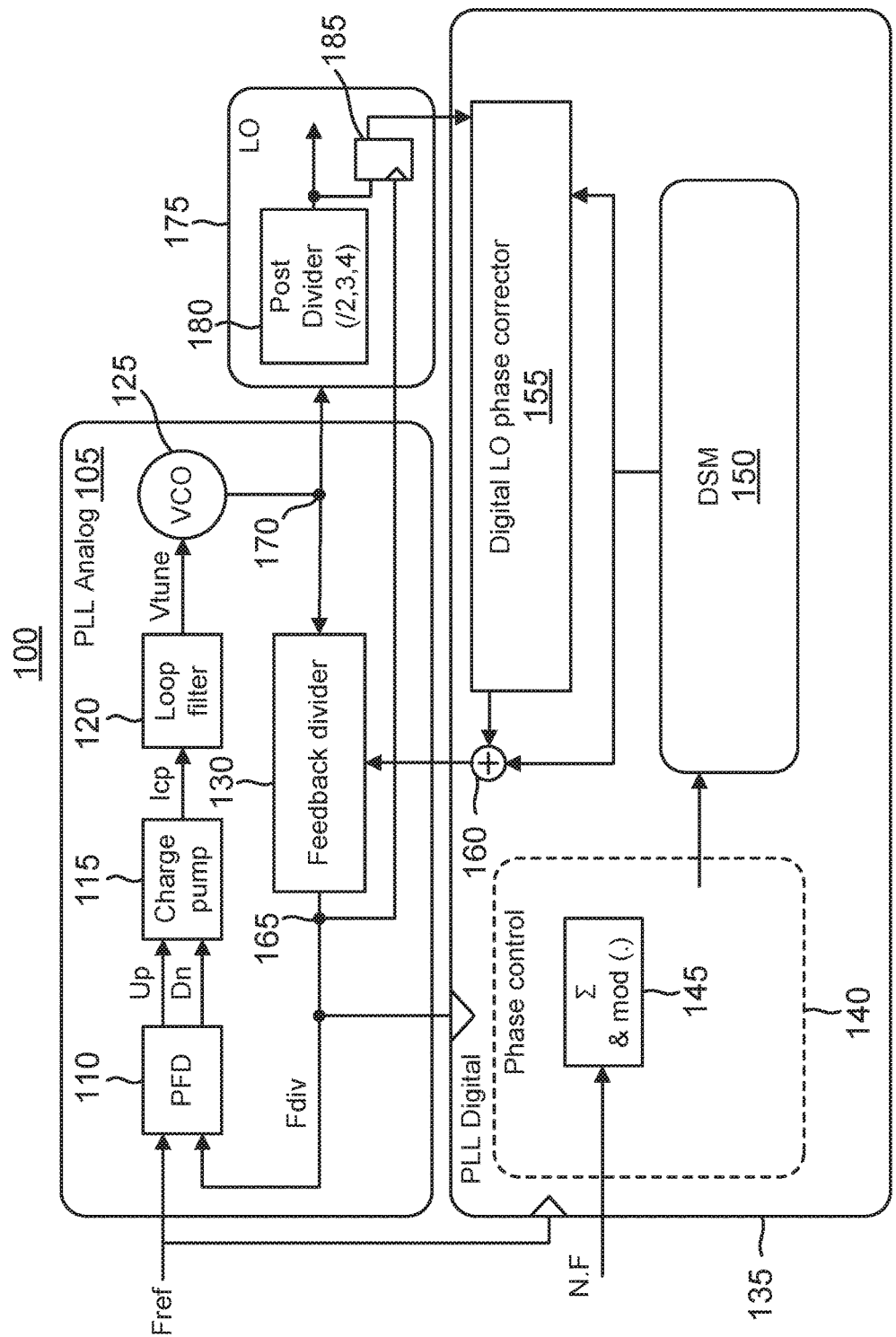
FIG. 1 is a diagram of a conventional phase continuity scheme for the post dividing of an output signal from a fractional-N PLL.
Figure 2:
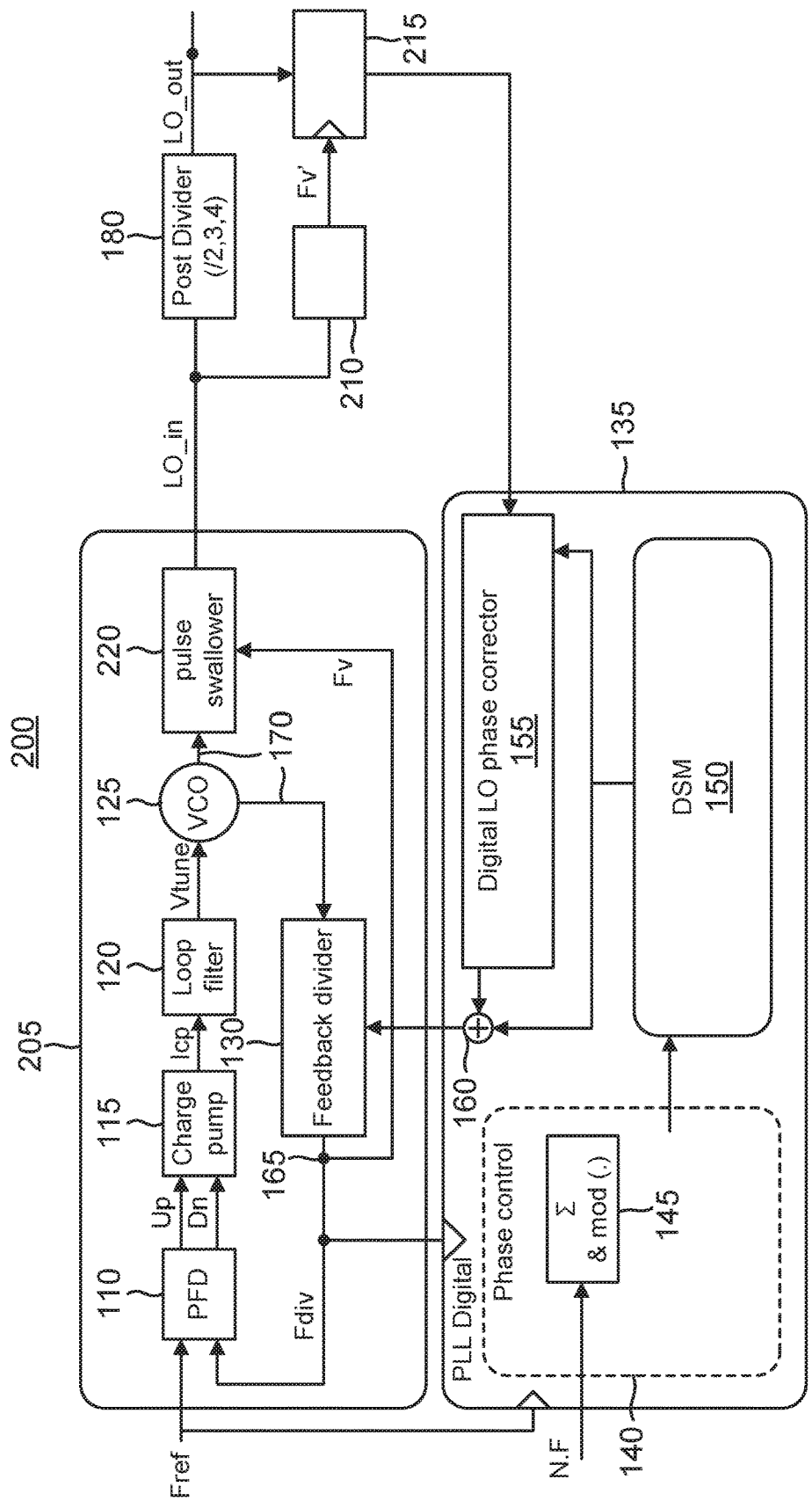
FIG. 2 is a diagram of an improved phase continuity architecture for the post dividing of an output signal from a fractional-N PLL in accordance with an aspect of the disclosure.

Since the divided feedback clock signal no longer needs to propagate to the vicinity of the post divider, there is no issue with regard to keeping the (now missing) divided feedback clock signal propagation electrically matched to the propagation of the modified PLL output signal from the fractional-N PLL to the post divider. The sampling of the post divider phase is thus accurate and repeatable across temperature and voltage variations. These advantageous properties may be better appreciated through a consideration of an example phase continuity architecture 200 shown in FIG. 2. An analog portion 205 and a digital portion 135 form a fractional-N PLL as discussed analogously with regard to FIG. 1. For example, PLL output signal 170 is divided in feedback divider 130 to form a divided feedback clock signal (Fdiv) 165 that is compared with the reference clock signal (Fref) in phase detector (PFD) 110. Depending upon whether divided feedback clock signal 165 is leading or lagging the reference clock signal, phase detector 110 asserts either the up signal (Up) or the down signal (Dn). Charge pump 115 charges its charge pump output signal (Icp) if the up signal is asserted or discharges the charge pump output signal if the down signal is asserted. After filtering in loop filter 120, the charge pump output signal becomes a tuning control voltage Vtune that controls the frequency of voltage-controlled oscillator VCO 125. Digital portion 135 toggles or dithers the integer N used by fractional divider 130 to effect the desired integer plus some fraction relationship between the frequency of the reference clock signal and the clocking signal frequency for PLL output signal 170. However, PLL output signal 170 is not transmitted towards post divider 180 as discussed with regard to FIG. 1. Instead, a pulse swallower circuit 220 removes ("swallows") a pulse in PLL output signal 170 responsive to an edge of divided feedback clock signal 165 to form an a modified PLL output signal (LO_in).

Post divider 180 divides the modified PLL output signal from pulse swallower circuit 220 to form the a post divided output signal (LO_out). For example, post divider 180 may divide the modified PLL output signal by 2, or by 3, or by 4, and so on to form the LO output signal. A clock recovery circuit 210 detects the missing pulse in the modified PLL output signal to assert a recovered divided clock signal Fv' accordingly to clock a sampling circuit such as a register 215 to sample the post divided output signal. The recovered divided clock signal Fv' can have either a positive or negative logic convention. In a positive logic convention, the recovered divided clock signal Fv' is asserted to the power supply voltage by clock recovery circuit 210 responsive to the missing pulse detection. In such an embodiment, register 215 samples the post divided output signal responsive to a rising edge of the recovered divided clock signal Fv'. In a negative logic convention embodiment, clock recovery circuit 210 may ground the recovered divided clock signal Fv' from a default high state responsive to the missing pulse detection. In such an embodiment, register 215 samples the post divided output signal responsive to a falling edge of the recovered divided clock signal Fv'. In one embodiment, clock recovery circuit 210 and the sampling circuit form a means for sampling the post divided output signal (LO_out) responsive to the missing pulse in the modified PLL output signal (LO_in) to determine a phase relationship between the post divided output signal and the divided feedback clock signal.

Digital LO phase corrector 155 responds to the sampled phase of the LO output signal as captured by register 215 to adjust the dithering of the feedback division in feedback divider 165 to maintain phase continuity for the LO output signal. In particular, digital LO phase corrector 150 samples the phase relationship of the LO output signal prior to a sleep mode for post divider 180 and the corresponding fractional-N PLL. Following a transition from the sleep mode to active operation, digital LO phase corrector 150 again samples the phase relationship and adjusts the feedback division accordingly to maintain phase continuity with the phase relationship that existed prior to the sleep mode operation.

Figure 3:
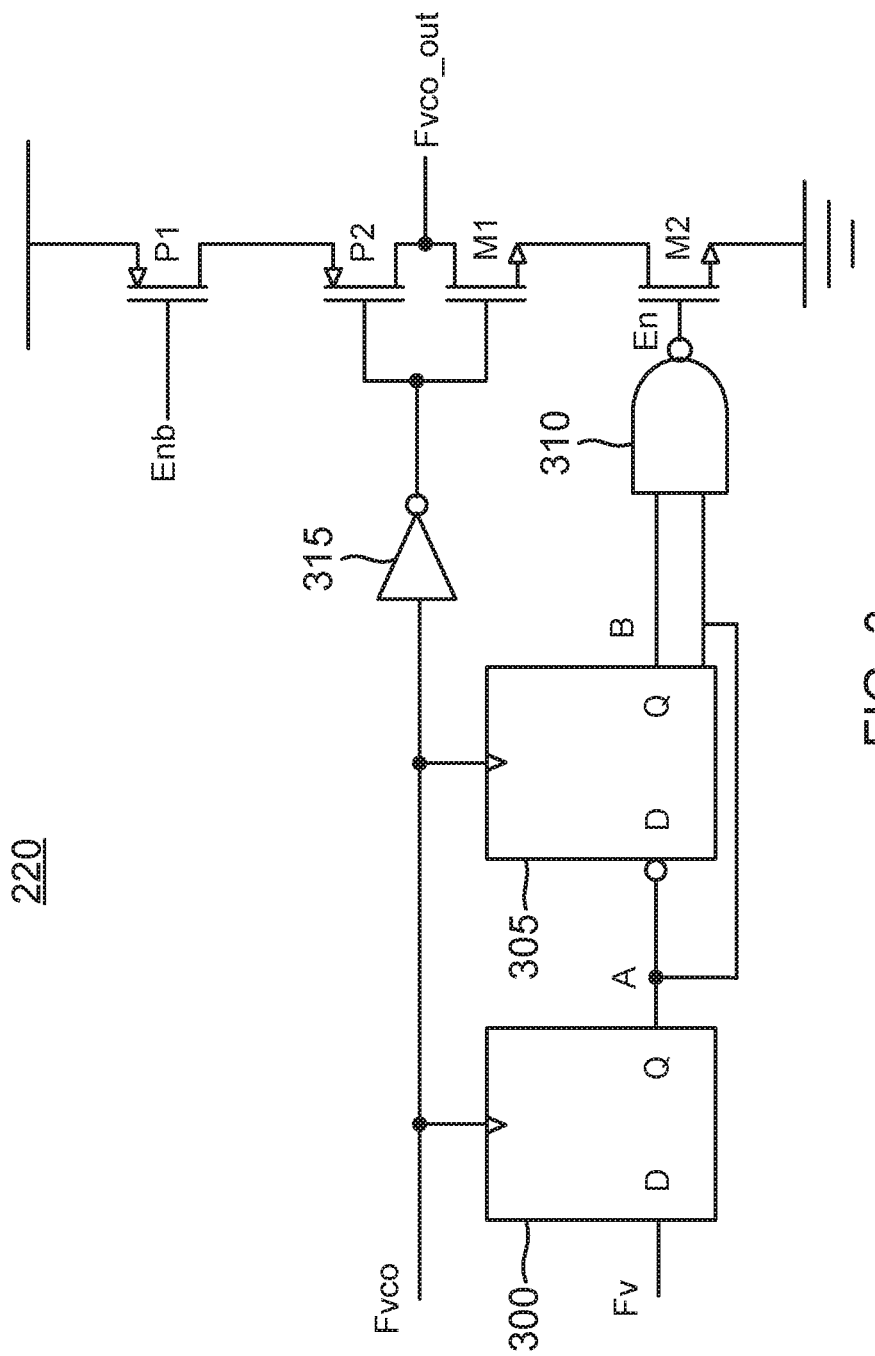
FIG. 3 is a circuit diagram of a pulse swallower circuit in the phase continuity architecture of FIG. 2 in accordance with an aspect of the disclosure.

An example pulse swallower circuit 220 is shown in more detail in FIG. 3. The PLL output signal 170 (Fvco) clocks a first register 300 and also a second register 305. First register 300 receives divided feedback clock signal 165 (Fv) at its data (D) input. The Q output from register 300 is inverted to drive the D input for second register 305. The Q output from first register 300 is denoted as a signal A whereas the Q output from second register 305 is denoted as a signal B. The A and B signals are NANDed in a NAND gate 310 to drive an enable signal (En) to a gate of an NMOS transistor M2 having a source tied to ground. The drain of transistor M2 is tied to the source of an NMOS transistor M1 that has a drain connected to the drain of a PMOS transistor P2. The source of transistor P2 connects to a drain of a PMOS transistor P1 having its source tied to a power supply voltage node. An active-low enable signal Enb drives the gate of transistor P1 so that transistor P1 is on during normal operation. When transistor M2 is conducting, transistors M1 and 2 function as an inverter to invert the output from an inverter 315 that in turn inverts PLL output signal 170. The drain terminals for transistors P2 and M1 drive the modified PLL output signal (Fvco_out).

Figure 4:
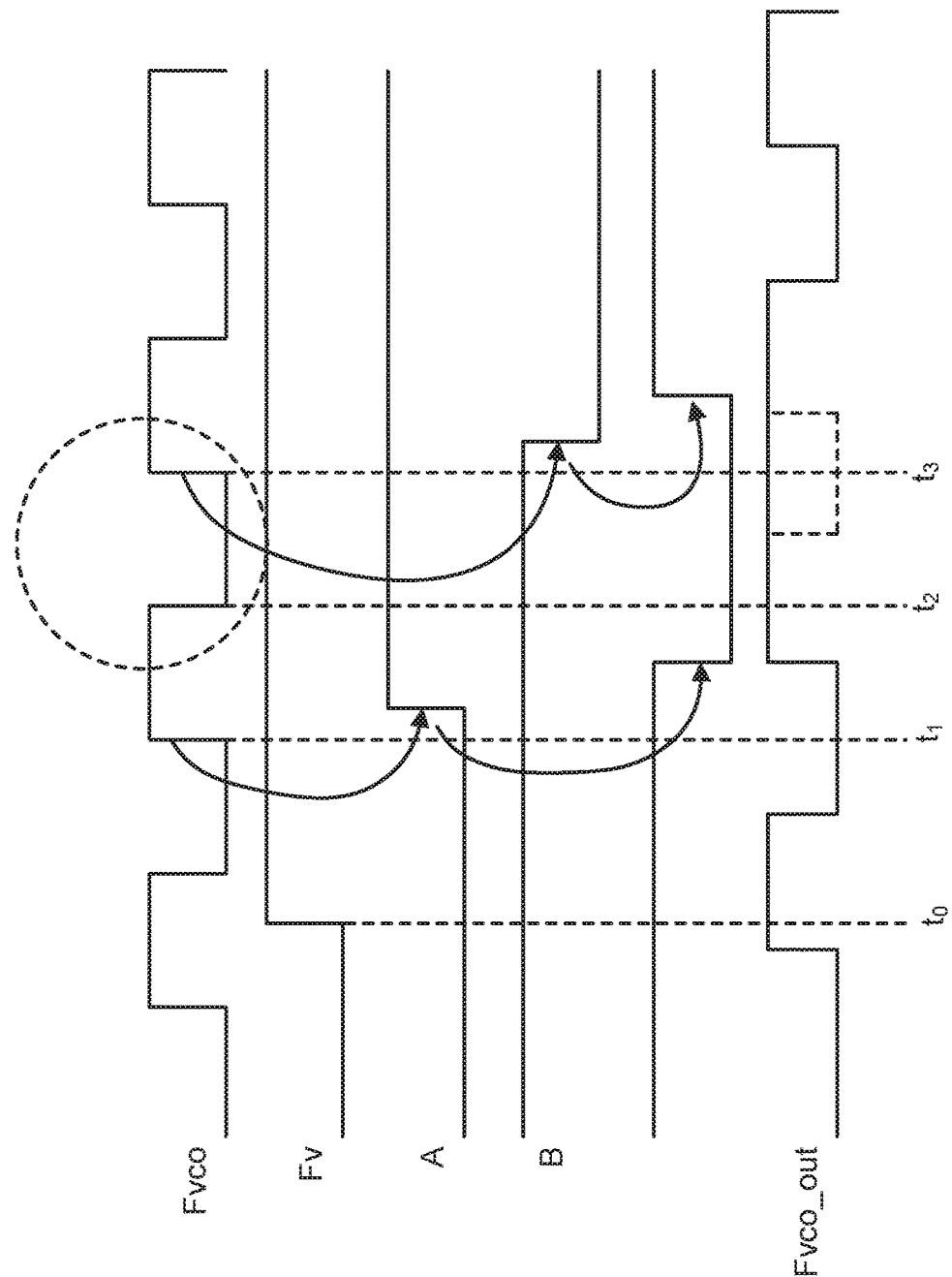
FIG. 4 illustrates some operating waveforms for the pulse swallower circuit of FIG. 4.

Operation of pulse swallower circuit 220 may be better appreciated with reference to the waveforms shown in FIG. 4. At a time t0, the divided feedback clock signal (Fv) has a rising edge. This rising edge is not sampled in first register 300 until the PLL output signal (Fvco) has a rising edge at a time t1, which causes signal A to be asserted to the power supply voltage. Since the default state for signal B is high, both signals A and B are high at the rising edge for signal A, which causes the enable signal En to go low. Due to the inversion at the data input for second register 305, the high state for signal A is registered as a low state in second register 305 at the subsequent rising edge of the PLL output signal Fvco at a time t3, which causes the discharge of signal B. The discharge of signal B causes the enable signal En to again go high. Due to the delay caused by inverter 315 and the inverter formed by transistors P2 and M1, the modified PLL output signal Fvco_out is a delayed version of the PLL output signal Fvco. But the falling edge of the PLL output signal Fvco at a time t2 is not reflected in the modified PLL output signal Fvco_out because the low state for the enable signal En causes the modified PLL output signal Fvco_out to float high at that time. Similarly, the modified PLL output signal Fvco_out does not react to the rising edge for the PLL output signal Fvco at time t3 because the modified PLL output signal Fvco_out is already high at that time. The pulse low for the PLL output signal Fvco from time t2 to time t3 is thus removed by pulse swallower circuit 220 from the modified PLL output signal Fvco_out.

Figure 5:
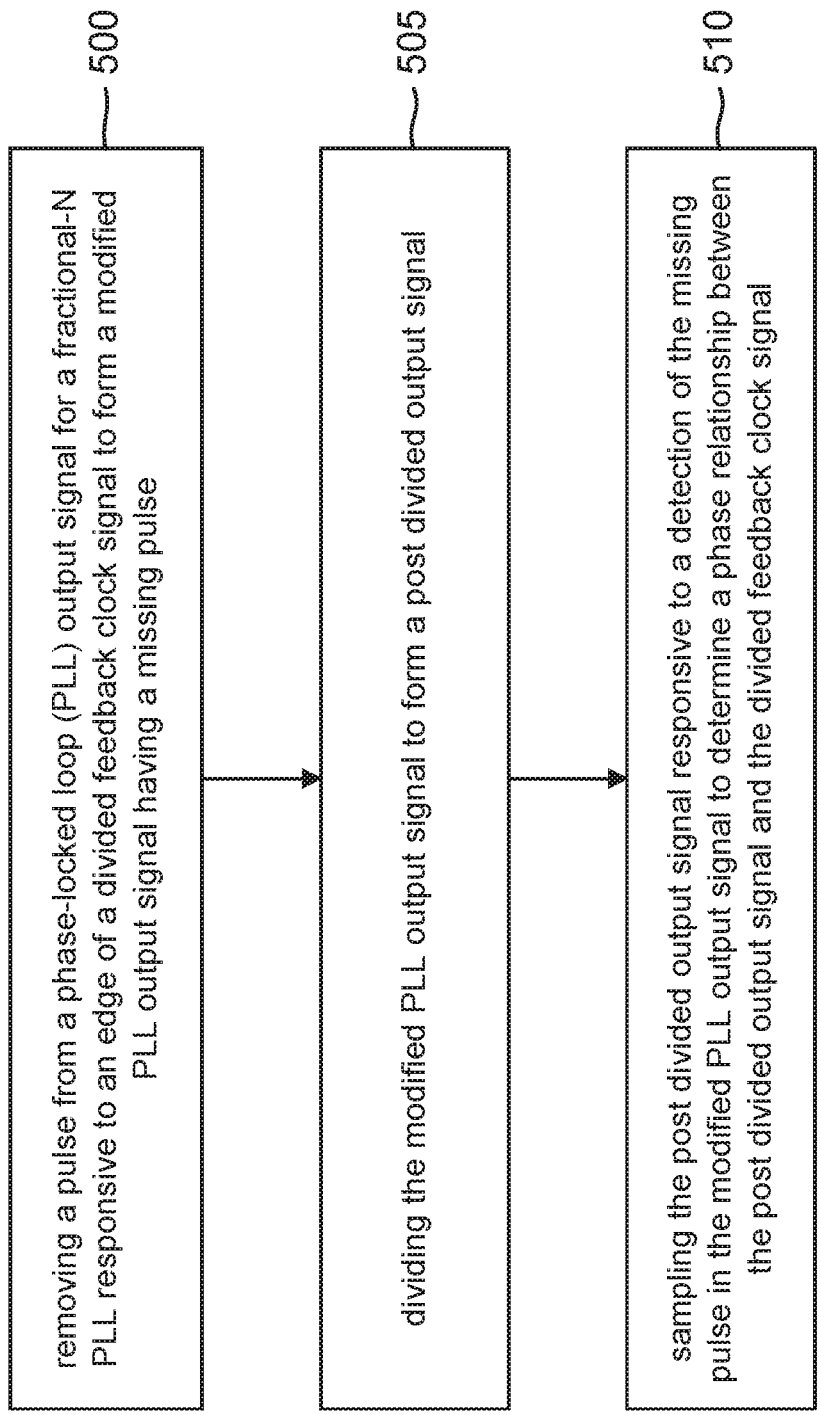
FIG. 5 is a flowchart for a method of operation for maintaining phase continuity for the post dividing of a PLL output signal from a fractional-N PLL in accordance with an aspect of the disclosure.

A method of operation for the phase continuity scheme will now be discussed with regard to the flowchart of FIG. 5. The method includes an act 500 of removing a pulse from a phase-locked loop (PLL) output signal for a fractional-N PLL responsive to an edge of a divided feedback clock signal to form a modified PLL output signal having a missing pulse. The removal of a pulse by pulse swallower circuit 210 to form the modified PLL output signal Fvco_out is an example of act 500. The method also includes an act 505 of dividing the modified PLL output signal in a post divider to form the post divided output signal. The post division by post divider 180 is an example of act 505. Finally, the method includes an act 510 of, at a first time, sampling the post divided output signal responsive to a detection of the missing pulse in the modified PLL output signal to determine a first phase relationship between the post divided output signal and the divided feedback clock signal. The determination of the phase relationship in digital LO phase corrector circuit 155 responsive to the sampling of the post divider output signal LO_out in register 215 is an example of act 510.

Note that analog portion 105 may be modified by replacing phase detector 110 and charge pump 115 with a time-to-digital converter. The loop filtering in such a digital fractional-N PLL embodiment would then be digital. It will thus be appreciated that many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:
1. A system, comprising:
a feedback divider for a fractional-N phase-locked loop (PLL), wherein the feedback divider is configured to divide a PLL output signal for the fractional-N PLL to form a divided feedback clock signal;
a pulse swallower circuit configured to remove a pulse from the PLL output signal responsive to an edge for the divided feedback clock signal to form a modified PLL output signal having a missing pulse;
a post divider for post dividing the modified PLL output signal to form a post divided output signal;
a clock recovery circuit configured to assert a recovered divided feedback clock signal responsive to the missing pulse in the modified PLL output signal; and a sampling circuit configured to sample the post divided output signal responsive to the assertion of the recovered divided feedback clock signal.

2. The system of claim 1, further comprising:
a digital phase corrector circuit configured to receive a sample of the post divided output signal from the sampling circuit at a first time to determine a first phase relationship between the post divided output signal and the divided feedback clock signal.

3. The system of claim 2, wherein the digital phase corrector circuit is further configured to receive another sample of the post divided output signal from the sampling circuit at a second time to determine a second phase relationship between the post divided output signal and the divided feedback clock signal.

4. The system of claim 3, wherein the second time is after the first time.

5. The system of claim 3, wherein the first time is prior to a sleep mode of operation for the fractional-N PLL and wherein the second time is after a termination of the sleep mode of operation for the fractional-N PLL, and wherein the digital phase corrector circuit is further configured to adjust a division by the feedback divider to maintain a phase continuity for the post divided output signal when the first phase relationship does not equal the second phase relationship.

6. The system of claim 3, wherein the post divider is a local oscillator post divider.

7. The system of claim 3, wherein the fractional-N PLL includes:
a phase control circuit configured to perform a phase accumulation, wherein the feedback divider is configured to divide an output clock signal by an integer divisor that is adjusted responsive to the phase accumulation to form the divided feedback clock signal; and
an oscillator configured to drive the PLL output signal at an output frequency responsive to a control signal so that the PLL output signal is phase aligned with a reference clock signal.

8. The system of claim 7, wherein the phase control circuit further includes:
a delta-sigma modulator; and
an adder configured to add an output from the delta-sigma modulator and an output from the digital phase corrector circuit, wherein the feedback divider is further configured to adjust the integer divisor by a sum signal from the adder.

9. The system of claim 7, further comprising:
a phase detector configured to compare the divided feedback clock signal to the reference clock signal to detect whether the divided feedback clock signal is leading or lagging the reference clock signal.

10. The system of claim 9, further comprising:
a charge pump configured to charge or discharge a charge pump output signal responsive to the detection by the phase detector; and
a loop filter configured to filter the charge pump output signal to form a control voltage, wherein the oscillator is a voltage-controlled oscillator configured to be responsive to the control voltage.

11. The system of claim 1, wherein the pulse swallower circuit comprises a first register and a second register that are both configured to be clocked by the PLL output signal.

12. The system of claim 11, wherein the pulse swallower circuit further comprises:

a NAND gate configured to NAND a data output signal from the first register with a data output signal from the second register.

13. The system of claim 12, wherein the pulse swallower circuit further comprises:
a first inverter configured to invert the PLL output signal;
a second inverter configured to invert an output signal from the first inverter to form the modified PLL output signal; and
a transistor coupled between a ground node for the second inverter and ground, wherein the transistor is configured to switch off responsive to a discharge of an output signal from the NAND gate.

14. A method of sampling the phase of a post divided output signal, comprising:
removing a pulse from a phase-locked loop (PLL) output signal for a fractional-N PLL responsive to an edge of a divided feedback clock signal to form a modified PLL output signal having a missing pulse;
dividing the modified PLL output signal in a post divider to form the post divided output signal; and
at a first time, sampling the post divided output signal responsive to a detection of the missing pulse in the modified PLL output signal to determine a first phase relationship between the post divided output signal and the divided feedback clock signal.

15. The method of claim 14, further comprising:
at a second time subsequent to the first time, sampling the post divided output signal responsive to a detection of the missing pulse in the modified PLL output signal to determine a second phase relationship between the post divided output signal and the divided feedback clock signal.

16. The method of claim 15, further comprising:
adjusting a feedback division in the fractional-N PLL for forming the divided feedback clock when the second phase relationship does not equal the first phase relationship to maintain a phase continuity for the post divided output signal with the first phase relationship.

17. The method of claim 15, further comprising shutting down the fractional-N PLL and the post divider during a period between the first time and the second time.

18. A system, comprising:
a feedback divider for a fractional-N phase-locked loop (PLL), wherein the feedback divider is configured to divide a PLL output signal from the fractional-N PLL to form a divided feedback clock signal;
a pulse swallower circuit configured to remove a pulse from the PLL output signal responsive to an edge for the divided feedback clock signal to form a modified PLL output signal with a missing pulse;
a post divider for post dividing the modified PLL output signal to form a post divided output signal; and
means for sampling the post divided output signal responsive to the missing pulse in modified PLL output signal to determine a phase relationship between the post divided output signal and the divided feedback clock signal.

19. The system of claim 18, further comprising:
a phase control circuit configured to perform a phase accumulation, wherein the feedback divider is configured to divide the PLL output signal by an integer divisor that is adjusted responsive to the phase accumulation to form the divided feedback clock signal; and an oscillator configured to drive the PLL output signal at an output frequency responsive to a control signal so that the PLL output signal is phase aligned with a reference clock signal.

20. The system of claim 19, further comprising:
a phase detector configured to compare the divided feedback clock signal to the reference clock signal to detect whether the divided feedback clock signal is leading or lagging the reference clock signal.

* * * * *